(12) United States Patent
Stave

(10) Patent No.: US 6,707,312 B2
(45) Date of Patent: Mar. 16, 2004

(54) PSEUDO VARIABLE RESISTOR FOR TESTER PLATFORM

(75) Inventor: Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/988,987

(22) Filed: Nov. 19, 2001

(65) Prior Publication Data

US 2003/0094958 A1 May 22, 2003

(51) Int. Cl.⁷ ................................. G01R 31/26
(52) U.S. Cl. ........................................ 324/765
(58) Field of Search ..................... 324/765, 691, 324/525, 537, 761, 763, 711, 714, 719, 158.1, 115, 149; 702/57, 65, 69; 438/10, 17; 361/93.7; 338/332

(56) References Cited

U.S. PATENT DOCUMENTS 5,955,890 A  *  9/1999  Gillette ........................ 326/30
6,262,580 B1  *  7/2001  Wu ............................ 324/713

* cited by examiner

*Primary Examiner*—N. Le
*Assistant Examiner*—Amy He
(74) *Attorney, Agent, or Firm*—Schwegman, Lundberg, Woessner & Kluth, P.A.

(57) ABSTRACT

Testing a range of output resistances of an integrated circuit includes connecting the integrated circuit to a tester through a fixed resistive network and measuring the range of output resistances of the integrated circuit without varying the resistance value of the resistive network.

48 Claims, 6 Drawing Sheets

| $R_{EXP}$ (OHMS) | R1+R2 (VIRTUAL) (OHMS) |
|---|---|
| 35 | 175 |
| 40 | 200 |
| 45 | 225 |
| 50 | 250 |
| 55 | 275 |
| 60 | 300 |
| 65 | 325 |
| 70 | 350 |

FIG. 3

PSEUDO VARIABLE RESISTOR FOR TESTER PLATFORM

TECHNICAL FIELD OF THE INVENTION

The present invention relates generally to testing integrated circuits, and in particular to testing output resistance of an integrated circuit.

BACKGROUND OF THE INVENTION

Manufacturers routinely test integrated circuits (IC) such as microprocessors, application specific integrated chips, and memory devices to ensure their quality and specifications.

Testing an output resistance of an IC ensures that the IC communicates properly with other circuits by matching its specified output resistance with the resistance of the others. Output resistance is also commonly referred to as output impedance.

Some conventional ICs have a fixed output resistance. Many conventional methods are available to test the fixed output resistance. Typically, a tester applies a series of test sequences to the ICs to read the fixed output resistance.

Some other conventional ICs have a range of output resistances. Some of these ICs usually have a special pin for connecting to ground through a resistor. Depending on a specific application of the IC, a user can choose different values for the resistor to get the desirable output resistance within the specified range of output resistances.

Because some ICs have a range of output resistances, testing the range of output resistances of these ICs using the method of testing the fixed output resistance of other ICs may not be appropriate.

For these and other reasons stated below, and which will become apparent to those skilled in the art upon reading and understanding the present specification, there is a need for a method of testing a range of output resistances of an integrated circuit.

SUMMARY OF THE INVENTION

The present invention provides a test system that tests a range of output resistances of an IC.

In one aspect, the test system presents an IC and a resistance circuit. The resistance circuit connects between the IC and a tester. The resistance circuit includes a fixed resistor acted as a match load. To test the output resistance range, a programmable voltage is applied at the tester. The programmable voltage changes the amount of current flowing though the fixed resistor to cause the IC into believing that it is connected to a different resistor. Therefore, the entire range of output resistances can be tested without changing the resistance value of the match load.

In another aspect, a method of testing an IC selects a resistance value, and calculates a current value based on the resistance value. The method calculates a dropped voltage across a resistive network connected between a pin of the IC and ground based on the current value. The method determines a test voltage and applies the test voltage to a tester connected to the pin. Further, the method measures an output resistance of the IC.

BRIEF DESCRIPTION OF THE DRAWINGS

FIG. 3 shows some expected output resistance values and corresponding virtual resistance values.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
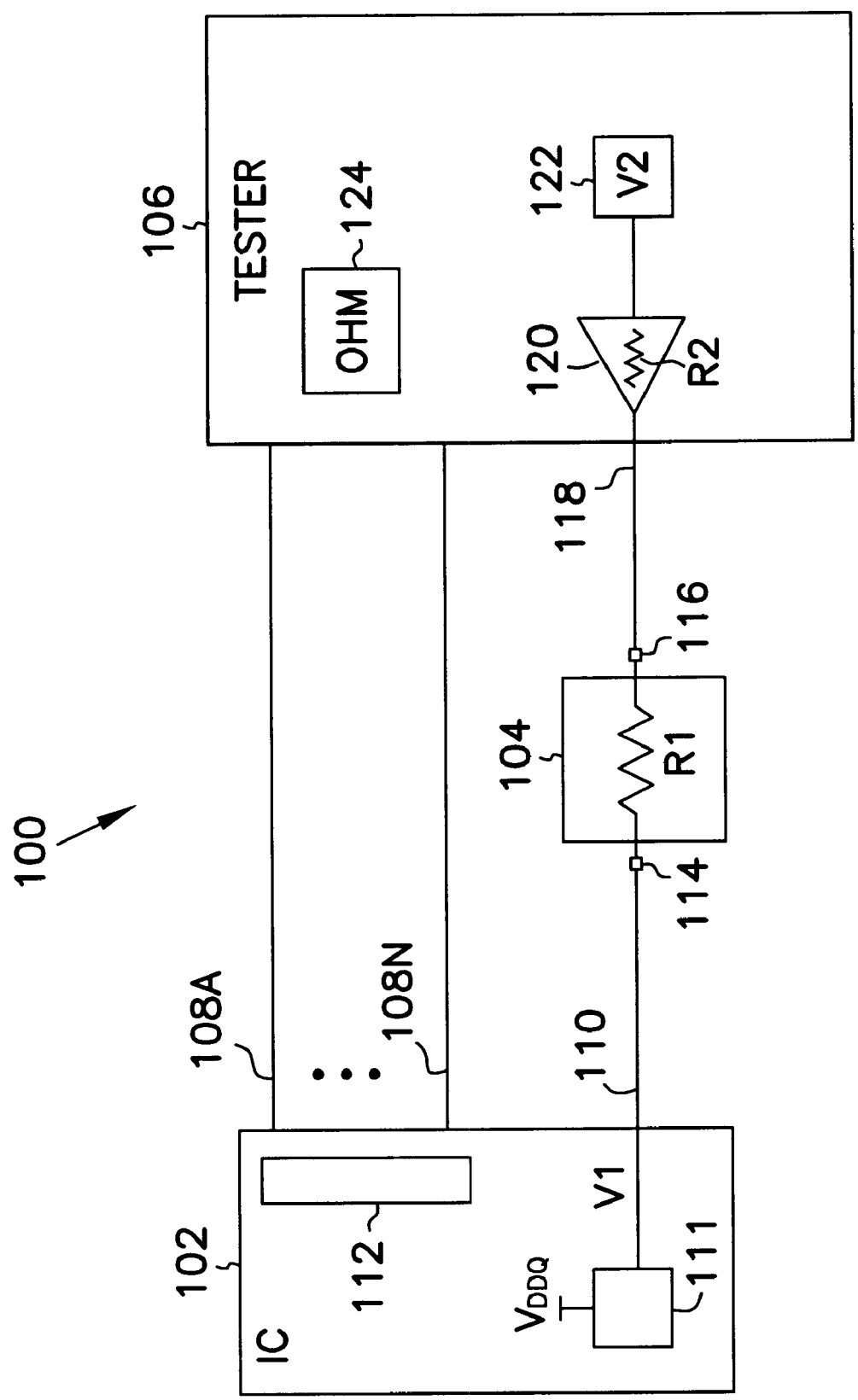
FIG. 1 shows a test system according to an embodiment of the invention.

FIG. 1 shows a test system 100 according to an embodiment of the invention. Test system 100 includes an IC 102, a resistor circuit 104, and a tester 106. IC 102 includes a plurality of pins 108A to 108N and 110 connected to tester 106. IC also includes a scale model output circuit 111 connected to a voltage source $V_{DDQ}$ to maintain a constant voltage V1 at pin 110. Vi is a function of $V_{DDQ}$. Resistance circuit 104 includes a resistor R1 connected between a first terminal 114 and a second terminal 116. First terminal 114 connects to pin 110 of IC 102. Second terminal 116 connects to a test channel 118 of tester 106. A driver 120 of tester 106 drives test channel 118 with a test voltage source 122 which has a voltage of V2. Driver 120 has an output impedance indicated by a resistance R2. Tester 106 also includes a measurement unit 124, indicated by OHM, to measure an output resistance of IC 102 during a test.

IC 102 can be a processor, a controller, an application specific integrated circuit, or any type of integrated circuits. IC 102 can also be a static random access memory (SRAM) or other types of memory circuits such as DRAM (Dynamic Random Access Memory) or Flash memory. Further, IC 102 can be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

Pins 108A to 108N and 110 of IC 102 can be internal pads that represent input, output, or both input and output terminals of IC 102 in wafer form. These pins can also can be external pins of IC 102 in package form. Pins 108A to 108N and 110 receive signals such as address, data, and control signals communicated to and from IC 102. Pin 110 can also be a test pin.

Resistor R1 is a fixed resistor and connects in series with driver 120. Since driver 120 has an output impedance R2, R1 effectively connects in series with R2. R1 and R2 form a resistive network. During a test, the resistive network provides a current path from pin 110 through R1 and R2.

In the embodiment of FIG. 1, IC 102 has an output resistance range of 35 to 70 ohms. V1 is about one half of $V_{DDQ}$ or about 0.75 volt, resistor R1 has a resistance of 200 ohms, resistance R2 is 50 ohms, and V2 can be programmed or varied. Thus, the resistive network has a resistance of 250 ohms, i.e., the sum R1 and R2. In other embodiments, the output resistance range, V1, R1, and R2 can have other values. Further, IC 102 also includes an internal scale circuitry 112 that provides a scale factor M. In the embodiment of FIG. 1, M equals 0.2. In other embodiments, however, M can be different depending on a specific design of the IC. The scale factor M is used to calculate the output resistance of IC 102. Multiplying the scale factor M with the resistance connected to pin 108 produces a value of the output resistance of IC 102. For example, when a resistance of 250 ohms connects to pin 108, the output resistance is 50 ohms (0.2×250).

During a test, when V1 is greater than V2 and V2 is zero volts, multiplying the scale factor M with the resistance value of R1+R2 produces a value of an expected output resistance $R_{EXP}$ of IC 102. The expected output resistance is what the output resistance should be according specification. During a test, measurement unit 124 measures a value of the output resistance of IC 102. The measured value is compared with $R_{EXP}$. The result determines whether the measured output resistance of IC 102 meets the specification. REXP is calculated by a formula (1) as follows:

$$R_{EXP}=(M)\times(R1+R2) \quad (1)$$

For example, with M=0.2, R2+200 ohms, and R2=50 ohms, then $R_{EXP}$=(M)×(R1+R2)=(0.2)×(200+50)=50 ohms. During a test, tester 106 measures the output resistance of IC at pin 108A–108N. The measured output resistance is expected to be close to $R_{EXP}$, 50 ohms in the example.

Figure 2:
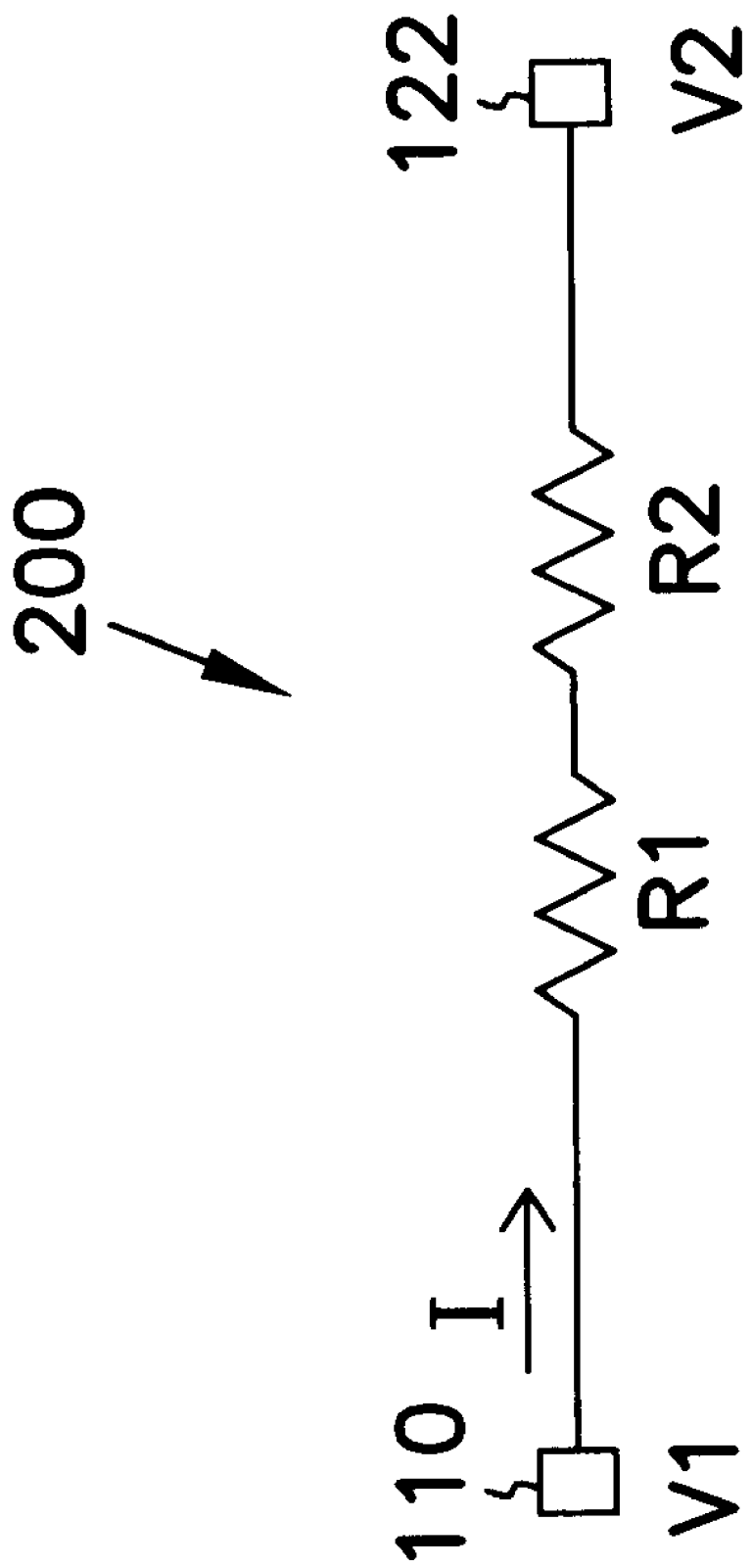
FIG. 2 is a model circuit of the test system of FIG. 1.

FIG. 2 is model circuit 200 of test system 100 of FIG. 1. Model circuit 200 includes R1 and R2 connected in series with each other and in between nodes 110 and 122. Node 110 represents pin 110 of IC 102 (FIG. 1) and node 122 represents voltage source 122 of tester 106 (FIG. 1). Node 110 has a voltage V1, node 122 has a voltage V2. R1, R2, V1 and V2 are the same elements as FIG. 1.

The output resistance of IC 102 is the resistance from each of the pins 108A to 108N and 110 to ground or to the supply voltage of IC 102. Therefore, in FIG. 2, if V2 at node 122 is zero volts, then node 122 serves as ground in model circuit 200. By arranging test system 100 as model circuit 200 with V1=0.75 volt, R1=200 ohms, R2=50 ohms, and V2=0 volts, the expected output resistance of IC 102 $R_{EXP}$ is 50 ohms (0.2×(200+50)). During the test, the actual output resistance of IC 102 is measured by measuring the value of output resistance of each of the pins 108A to 108N. The measured value of each pin is compared with the expected output resistance to determine whether the output resistance of IC meets specification. In one embodiment, the output resistance of IC 102 meets specification if the measured value is within 10% margin of the expected resistance value. For example, if the expected output resistance of 50 ohms, the measured value between 45 to 55 ohms is a pass.

Test system 100 is also capable of testing a range of output resistances of IC 102 without changing the values of R1 and R2. In the embodiments of FIG. 1 and FIG. 2, R1 is fixed at 200 ohms and R2 is fixed at 50 ohms. To test other output resistance, e.g., other resistance values in the range of 35 and 70 ohms, the value of V2 is varied while other values (V1, R1, R2) remains the same.

Referring to model circuit 200, when node 122 serves as ground (zero volts), the expected output resistance is calculated based on formula (1). To test other output resistance values within the range of 35 to 70 ohms, other value of R1 and R2 can be used. However, since R1 and R2 are fixed, test system 100 can still test the range of output resistances by changing the value of the current I flowing through R1 and R2 to force IC 102 to believes that it sees a different resistance from pin 110 to ground.

The current I flowing through R1 and R2 is calculated by a formula (2) as follows:

$$I=(V1-V2)/(R1+R2) \quad (2)$$

When V1=0.75 volt, V2=0, and R1 and R2 are fixed at 250 ohms, I=(0.75−0)/(250)=3 mA (milliampere). To simulate a different value of R1 and R2 without changing the value of R1 or R2 (or both), V2 is varied to change the current I, i.e., to increase or decrease the current I. When the current I changes, IC 102 believes it sees a different resistance.

In FIG. 1, IC 102 has an output resistance value in the range of 35 to 70 ohms. Therefore, the output resistance value is expected to be within that range during the test, i.e., $R_{EXP}$ is in the range of 35 to 70 ohms. According to formula (1), $R_{EXP}$=(M)×(R1+R2), therefore, R1+R2 can be selected based on formula (3) as follows:

$$(R1+R2)=R_{EXP}/M \quad (3)$$

In this formula, since $R_{EXP}$ is in the range of 35 to 70 ohms and M=0.2, the value R1+R2 is in the range of 175 to 350 ohms when calculated from formula (3). Since the value of R1 and R2 is fixed at 250 ohms (200+50), any value of R1+R2 between 175 and 350 (except 250 ohms) is not actual resistance but virtual resistance. The virtual resistance is the resistance that IC sees from pin 110 to ground when R1+R2 is fixed 250 ohms and V2 is not zero volts. According to formula (1), the expected $R_{EXP}$ of 50 ohms corresponds to a resistance of 250 ohms (R1+R2). Thus, other values of R1+R2 (virtual value) also have corresponding expected $R_{EXP}$ values.

FIG. 3 shows some values of expected output resistance $R_{EXP}$ and their corresponding virtual resistance. In FIG. 3, the values of $R_{EXP}$ correspond to the range of the output resistance of IC 102. The values of R1+R2, calculated from formula (3), are virtual resistance values. As shown in FIG. 3, R1+R2 of 250 ohms is the only value that matches actual values of R1+R2 of test system 100, and corresponds to $R_{EXP}$ of 50 ohms.

To test for an expected output resistance other than 50 ohms, for example, 60 ohms, first the corresponding virtual resistance of R1+R2 is identified, i.e., 300 ohms. Next, the value of current I is calculated from formula (2) I=(V1−V2)/(R1+R2). In this case I=(0.75−0)/300)=2.5 mA. In FIG. 2, since V1 is constant at 0.75 volts, R1+R2 is fixed at 250 ohms, to obtain a current of 2.5 mA flowing through R1 and R2, V2 is varied. Based on formula (2), V2 is calculated by formula (4) below:

$$V2=V1-[(I)\times(R1+R2)] \quad (4)$$

In the example of $R_{EXP}$=60 ohms, V2=0.75−[2.5 mA)× (200+50)]=0.125 volt. Therefore, to test an output resistance of 60 ohms, 0.125 volt is applied to V2. When 0.125 volt is applied at node 122 of FIG. 1, the measured output resistance value of each of the pins 108A to 108N is expected to be 60 ohms. Following the same method as the example of $R_{EXP}$=60 ohms, any value within the range of the output resistance of IC 102 can also be tested.

In the embodiment of FIG. 1, IC 102 has a scale factor M of 0.2. Therefore, the actual output resistance of IC 102 is the resistance connected to IC 102 multiplied by the scale factor M. For example, the resistance connected to IC 102 in FIG. 1 is 250 ohms (R1+R2). The actual output resistance is 50 ohms (250×0.2). In other embodiments, M may be other quantities and the actual output resistance of the IC may be scaled differently. For example, if M=1, the actual output resistance of IC 102 is the same as the resistance connected to it.

In the embodiment of FIG. 1, R1 is fixed. However, in alternative embodiments, R1 can be a variable resistor. When R1 is a variable resistor, during a test, R1 is varied and V2 is held constant at zero volt. For example, to test the output resistance of 35 to 70 ohms and R2=50 ohms, based on formula (3), R1 can be replaced with a variable resistor that has a resistance in the range of 125 to 300 ohms, where M=0.2.

Figure 4:
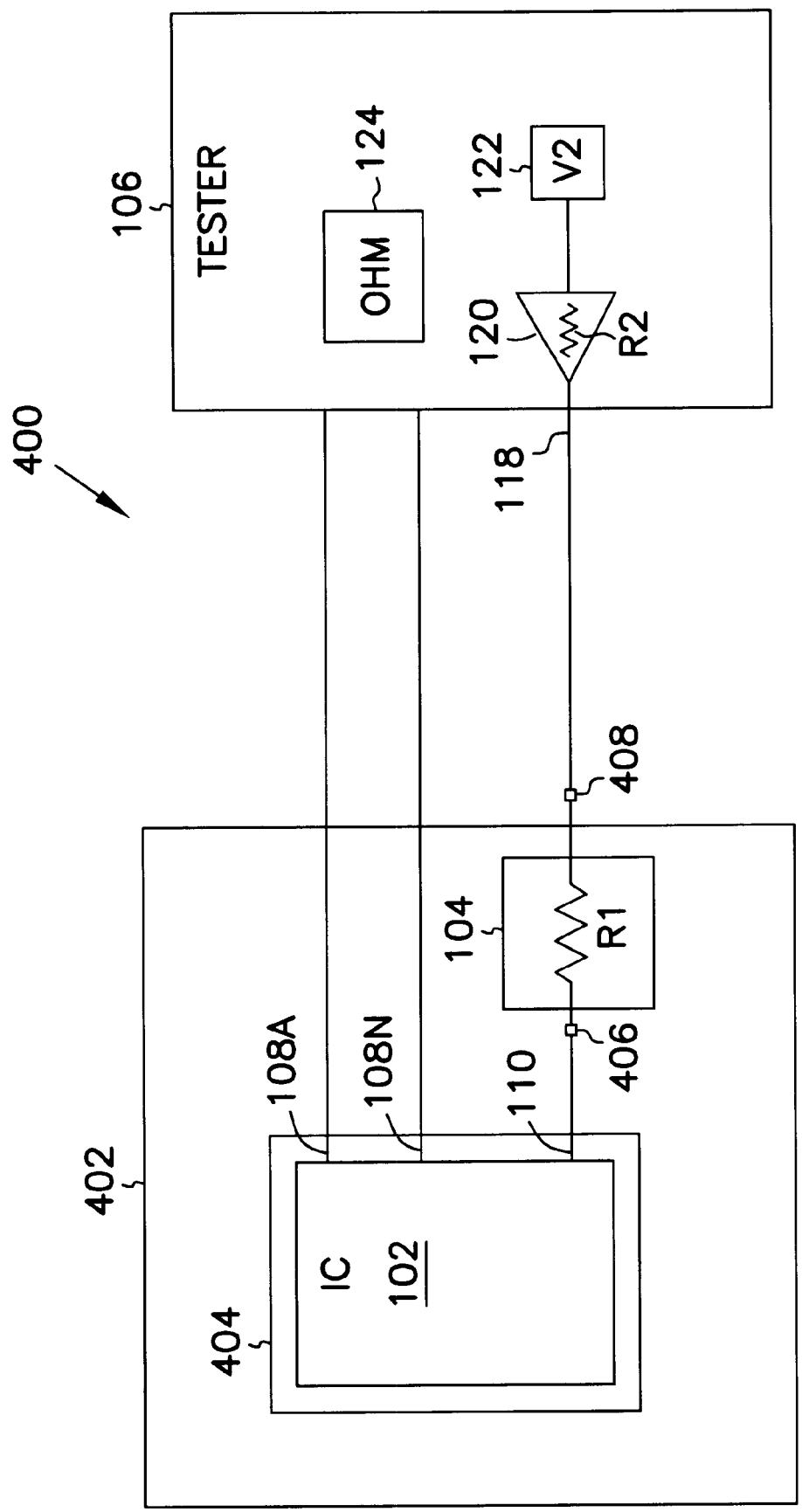
FIG. 4 shows a test system according to another embodiment of the invention.

FIG. 4 is a block diagram of a test system 400 according to another embodiment of the invention. System 400 is similar to test system 100 of FIG. 1. In system 400, however, resistor circuit 104 is a part of a load board or circuit board 402. Circuit board 402 includes a socket 404. Resistor R1 of resistor circuit 104 connects between a first and second terminals 406 and 408. First terminal 406 connects to socket 404 and second terminal connects to test channel 118 of tester 106. In FIG. 4, IC 102 is inserted into socket 402 such that pin 110 of IC connects to test channel 118 via resistance R2. Test system 400 tests output resistance of IC 102 the same fashion as test system 100 of FIG. 1.

Figure 5:
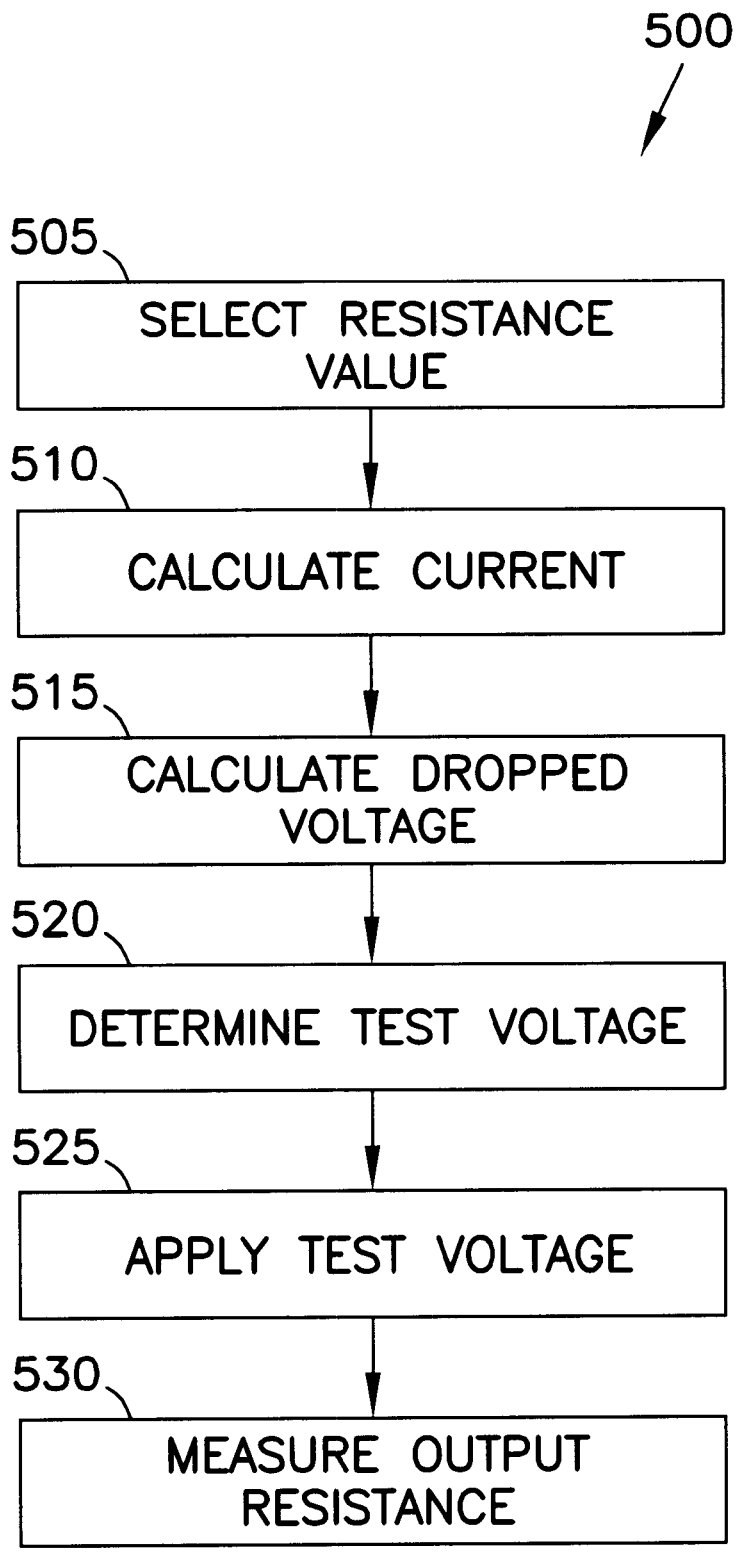
FIG. 5 is a flowchart of a method according to an embodiment of the invention.

FIG. 5 is a flowchart of a method 500 of testing output resistance of an IC. The IC includes a plurality of input/output pins; one of the pins can be a test pin which connects to a test channel of a tester through a load resistor. The load resistor is external to the IC. The load resistor connects to an internal resistor of the tester to form a resistor network between the test pin and ground. Method 500 tests a range of output resistances of the IC without changing the values of the load resistor and the internal resistor of the tester.

Box 505 selects a resistance value corresponding to the output resistance of the IC. Box 510 calculates a current value by dividing a voltage at the test pin by the selected resistance value. Box 515 calculates a dropped voltage across the both resistors. Box 520 determines a test voltage by calculating a difference between a voltage at the test pin and the dropped voltage. Box 525 applies the test voltage to a driver that drives the test channel of the tester. Box 530 measures the output resistance of the IC by measuring the output resistance of each of the input/output pins of the IC.

In one embodiment, the output resistance of the IC in method 400 is in the range of 35 to 75 ohms. The load resistor is 200 ohms, and the internal resistor of the tester is 50 ohms. The selected resistor value is in the range of 175 to 350 ohms. The voltage at the test pin is 0.75 volt. The test voltage is varied.

Figure 6:
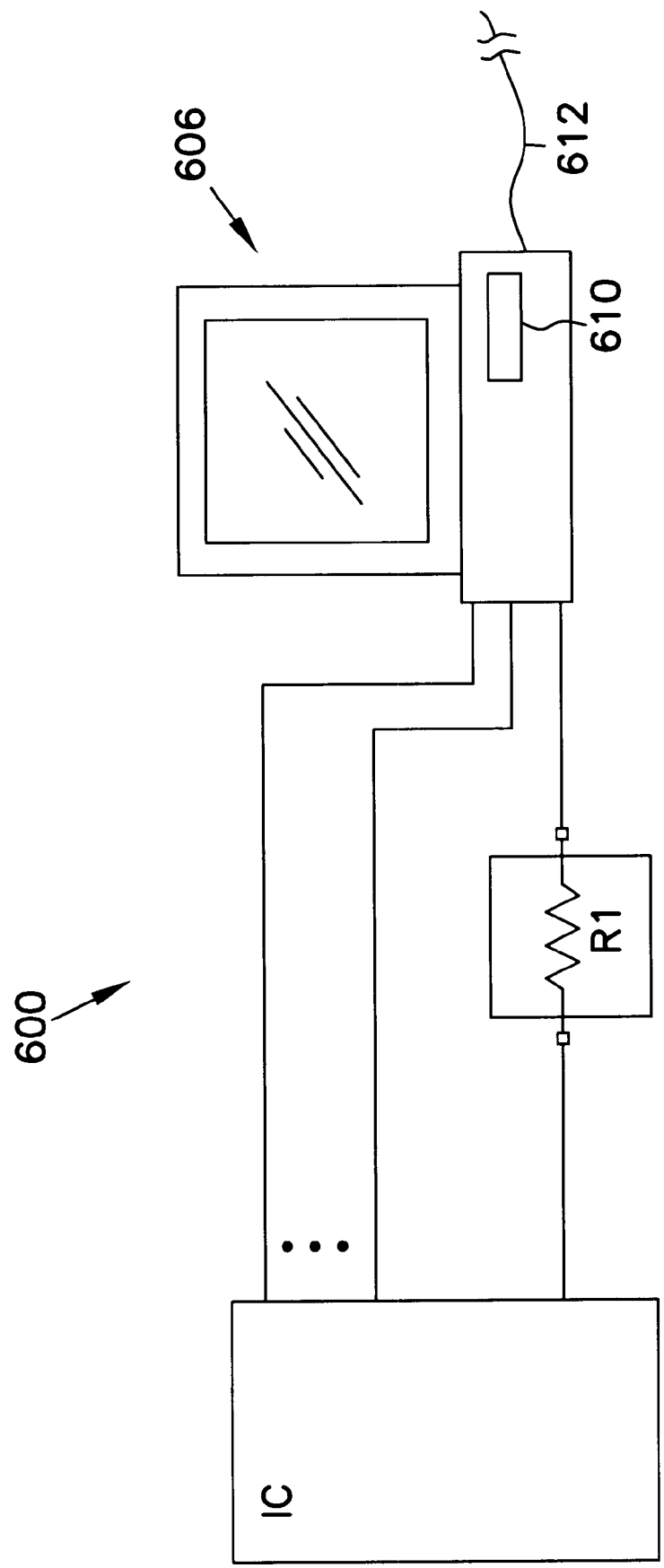
FIG. 6 shows a test system according to another embodiment of the invention.

FIG. 6 is a test system 600 according to another embodiment of the invention. Test system 600 is similar to test system 100 and test system 400. In FIG. 6, however, the tester is represented by a computer 606. Computer 606 includes a storage medium 610 and a communication line 612. Storage medium 610 can be a hard disk drive system for reading or writing information on a computer-readable medium such as a hard disk. Storage medium 610 can also be a magnetic or optical disk drive system for reading from or writing to a removable medium such as a disk. These disk drive systems and their associated media can be used to hold instructions for causing computer 606 to perform a test method such as method 400. However, any type of media which can store data accessible, such as magnetic cassettes, flash memory cards, optical disks, Bernoulli cartridges, random-access memories (RAMs), read only memories (ROMs), and the like, can be used to store instructions for causing computer 606 to perform test method 400. In addition, computer 606 can also download instructions from a remote site through communication line 612 to cause computer 606 to perform test method 400.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A system comprising:
    an integrated circuit; and
    a resistance circuit connected between the integrated circuit and a tester to test a range of output resistances of the integrated circuit without varying a resistance value of the resistance circuit.

2. The system of claim 1, wherein the resistance circuit includes a resistor.

3. The system of claim 2, wherein the resistor connects to a driver of the tester.

4. The system of claim 3, wherein the driver has an output impedance of 50 ohms.

5. The system of claim 3, wherein the resistor of the resistance circuit connects in series with the driver.

6. The system of claim 1, wherein the integrated circuit includes a plurality of memory cells.

7. A system comprising:
    an integrated circuit; and
    a resistance circuit connected between the integrated circuit and a tester to test a range of output resistances of the integrated circuit without varying a resistance value of the resistance circuit, wherein the range of output resistances is 35 to 75 ohms.

8. A system comprising:
    an integrated circuit including a test pin;
    a resistive element having a first terminal and a second terminal, the first terminal being connected to the test pin; and
    a tester connected to the second terminal for testing a range of output resistances of the integrated circuit without varying a resistance value of the resistive element.

9. The system of claim 8, wherein the resistive element has a fixed resistance.

10. The system of claim 8, wherein the resistive element has a variable resistance.

11. The system of claim 8, wherein the resistive element has a resistance range of 125 to 300 ohms.

12. The system of claim 8, wherein the tester includes a driver having an output impedance, the output impedance being connected to the resistive element.

13. The system of claim 12, wherein the output impedance has a value of 50 ohms.

14. The system of claim 12, wherein the resistive element connects in series with the driver.

15. A system comprising:
    an integrated circuit including a pin;
    a circuit board including:
        a first terminal connected to the pin;
        a second terminal; and a resistive element connected between the first terminal and the second terminal; and a tester connected to the second terminal for testing a range of output resistances of the integrated circuit without varying a resistance value of the resistive element.

16. The system of claim 15, wherein the resistive element is a fixed resistor.

17. The system of claim 15, wherein the resistive element is a variable resistor.

18. The system of claim 15, wherein the resistive element has a fixed resistance.

19. The system of claim 15, wherein the resistive element has a variable resistance.

20. The system of claim 15, wherein the resistive element has a resistance range of 125 ohms to 300 ohms.

21. The system of claim 15, wherein the tester includes a resistor, the resistor being connected to the resistive element.

22. The system of claim 21, wherein the resistor has a value of 50 ohms.

23. The system of claim 21, wherein the resistor connects in series with the resistive element.

24. A method of testing an integrated circuit, the method comprising:

connecting a pin of the integrated circuit to a first terminal of a resistive element;

connecting a second terminal of the resistive element to a voltage source of a tester;

applying a programmable voltage at the voltage source without varying a resistance value of the resistive element; and measuring a range of output resistances of the integrated circuit.

25. The method of claim 24, wherein measuring a range of output resistances includes measuring the output resistance of another pin of the integrated circuit.

26. A method of testing an integrated circuit, the method comprising:

connecting a pin of the integrated circuit to a first terminal of a resistive element;

connecting a second terminal of the resistive element to a voltage source of a tester;

applying a programmable voltage at the voltage source without varying a resistance value of the resistive element; and measuring an output resistance of the integrated circuit, wherein applying a programmable voltage includes applying a difference of a voltage at the pin and a dropped voltage across the resistive element.

27. A method of testing an integrated circuit, the method comprising:

determining a current value based on a voltage at a pin of the integrated circuit and a selected resistance value;

determining a dropped voltage across a load resistor and an output impedance of a driver of a tester based on the current value;

applying a test voltage to the driver based on a function of the voltage of the pin and the dropped voltage; and measuring an output resistance of the integrated circuit.

28. The method of claim 27, wherein determining a current value includes dividing the voltage at the pin by a value of the selected resistance.

29. The method of claim 27, wherein determining a dropped voltage includes multiplying the current value by the sum of values of the load resistor and the output impedance.

30. The method of claim 27, wherein applying a test voltage to the tester includes applying a difference in voltage between the voltage at the pin and the dropped voltage.

31. The method of claim 27, wherein measuring an output resistance includes measuring output resistance of another pin of the integrated circuit.

32. A method of testing an integrated circuit, the method comprising:

selecting a resistance value;

calculating a current value based on the resistance value;

calculating a dropped voltage across a resistive network connected between a pin of the integrated circuit and a driver of a tester based on the current value;

determining a test voltage;

applying the test voltage to the tester connected to the pin; and measuring an output resistance of the integrated circuit.

33. The method of claim 32, wherein selecting a resistance value includes selecting a value between 175 and 350 ohms.

34. The method of claim 32, wherein calculating a current value includes dividing a voltage value at the pin by the expected output resistance value.

35. The method of claim 32, wherein calculating a dropped voltage includes multiply the current value by a resistance value of the resistive network, wherein the resistive network includes a resistive element external to the integrated circuit connected in series with an output impedance of a driver of the tester.

36. The method of claim 32, wherein determining a test voltage includes calculating a difference between a voltage at the pin and the dropped voltage.

37. The method of claim 32, wherein measuring an output resistance includes measuring output resistance of another pin of the integrated circuit.

38. A computer-readable medium having instructions stored therein for causing a tester to perform a test method, the test method comprising:

determining a current value based on a voltage at a pin of the integrated circuit and a selected resistance value;

determining a dropped voltage across a load resistor and an output impendence of a driver of a tester based on the current value;

applying a test voltage to the driver based on a function of the voltage of the pin and the dropped voltage; and measuring an output resistance of the integrated circuit.

39. The medium of claim 38, wherein determining a current value includes dividing the voltage at the pin by a value of the selected resistance.

40. The medium of claim 39, wherein determining a dropped voltage includes multiplying the current value by the sum of values of the load resistor and the output impedance.

41. The medium of claim 38, wherein applying a test voltage to the tester includes applying a difference in voltage between the voltage at the pin and the dropped voltage.

42. The medium of claim 38, wherein measuring an output resistance includes measuring output resistance of another pin of the integrated circuit.

43. A computer-readable medium having instructions stored therein for causing a tester to perform a test method, the test method comprising:

selecting a resistance value;

calculating a current value based on the resistance value;

calculating a dropped voltage across a resistive network connected between a pin of the integrated circuit and a driver of a tester based on the current value;

determining a test voltage;

applying the test voltage to the tester connected to the pin; and measuring an output resistance of the integrated circuit.

44. The medium of claim 43, wherein selecting a resistance value includes selecting a value between 175 and 350 ohms.

45. The medium of claim 43, wherein calculating a current value includes dividing a voltage value at the pin by the expected output resistance value.

46. The medium of claim 43, wherein calculating a dropped voltage includes multiply the current value by a resistance value of the resistive network, wherein the resistive network includes a resistive element external to the integrated circuit connected in series with an output impedance of a driver of the tester.

47. The medium of claim 43, wherein determining a test voltage includes calculating a difference between a voltage at the pin and the dropped voltage.

48. The medium of claim 43, wherein measuring an output resistance includes measuring output resistance of another pin of the integrated circuit.

* * * * *

UNITED STATES PATENT AND TRADEMARK OFFICE
CERTIFICATE OF CORRECTION

PATENT NO. : 6,707,312 B2
DATED : March 16, 2004
INVENTOR(S) : Stave

It is certified that error appears in the above-identified patent and that said Letters Patent is hereby corrected as shown below:

Column 2,
Line 32, delete "Vi" and insert -- V1 --, therefor.
Line 55, after "can also" delete "can".

Column 3,
Line 19, after "according" insert -- to --.
Line 24, delete "REXP" and insert -- $R_{EXP}$ --, therefor.
Line 27, delete "R2+200" and insert -- R1=200 --, therefor.

Column 4,
Line 37, delete "$R_{EXP}$" and insert -- $R_{EXP}$ --, therefor.
Line 55, insert -- ( -- before "2.5 mA)".

Signed and Sealed this

Fifteenth Day of June, 2004

JON W. DUDAS
*Acting Director of the United States Patent and Trademark Office*